United States Patent
Lee et al.

(10) Patent No.: US 12,183,826 B2
(45) Date of Patent: Dec. 31, 2024

(54) VERTICAL FIELD EFFECT TRANSISTOR WITH LOW-RESISTANCE BOTTOM SOURCE-DRAIN CONTACT

(71) Applicant: International Business Machines Corporation, Armonk, NY (US)

(72) Inventors: Choonghyun Lee, Rensselaer, NY (US); Soon-Cheon Seo, Glenmont, NY (US); Injo Ok, Loudonville, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 296 days.

(21) Appl. No.: 17/302,986

(22) Filed: May 18, 2021

(65) Prior Publication Data
US 2021/0273115 A1    Sep. 2, 2021

Related U.S. Application Data

(62) Division of application No. 16/205,344, filed on Nov. 30, 2018, now Pat. No. 11,043,598.

(51) Int. Cl.
*H01L 29/786* (2006.01)
*H01L 21/324* (2006.01)
*H01L 29/10* (2006.01)
*H01L 29/40* (2006.01)
*H01L 29/417* (2006.01)

(52) U.S. Cl.
CPC ...... *H01L 29/78642* (2013.01); *H01L 21/324* (2013.01); *H01L 29/1037* (2013.01); *H01L 29/401* (2013.01); *H01L 29/41741* (2013.01)

(58) Field of Classification Search
CPC ......... H01L 29/7848; H01L 2029/7858; H01L 29/6656; H01L 29/456; H01L 29/0653; H01L 21/02532; H01L 29/66636
See application file for complete search history.

(56) References Cited

U.S. PATENT DOCUMENTS 6,653,181 B2    11/2003    Hergenrother
7,749,905 B2     7/2010    Cohen
(Continued)

FOREIGN PATENT DOCUMENTS

EP    0749162 B1    9/2003

OTHER PUBLICATIONS

List of IBM Patents or Patent Applications Treated as Related. Filed Herewith. 2 pages.

*Primary Examiner* — Mark W Tornow
*Assistant Examiner* — Priya M Rampersaud
(74) *Attorney, Agent, or Firm* — Kimberly Zillig; Andrew D. Wright; Calderon Safran & Wright P.C.

(57) ABSTRACT

A semiconductor structure, and a method of making the same includes a fin extending upward from a substrate, an epitaxially grown bottom source/drain region in direct contact with the substrate and a bottom portion of the fin. A bottom surface and sidewalls of a metal silicide layer are in direct contact with the epitaxially grown bottom source/drain region. A bottom spacer is located above and in direct contact with the metal silicide layer and a portion of the epitaxially grown bottom source/drain region not covered by the metal silicide layer, the bottom spacer surrounding the fin.

9 Claims, 15 Drawing Sheets

(56) References Cited

U.S. PATENT DOCUMENTS

| | | | |
|---|---|---|---|
| 8,492,228 B1* | 7/2013 | Leobandung | H01L 21/823462 |
| | | | 257/E21.409 |
| 8,742,510 B2 | 6/2014 | Baars | |
| 9,379,238 B2 | 6/2016 | Larrieu | |
| 9,520,501 B2 | 12/2016 | Koldiaev | |
| 9,748,359 B1* | 8/2017 | Gluschenkov | H01L 29/7827 |
| 9,853,127 B1 | 12/2017 | Anderson | |
| 9,966,448 B2 | 5/2018 | Lin | |
| 10,157,794 B1 | 12/2018 | Suvarna | |
| 2013/0154006 A1* | 6/2013 | Basker | H01L 29/41791 |
| | | | 438/151 |
| 2015/0371892 A1* | 12/2015 | Xie | H01L 21/76224 |
| | | | 438/424 |
| 2017/0186742 A1 | 6/2017 | Balakrishnan | |
| 2018/0358460 A1 | 12/2018 | Cheng | |
| 2018/0366372 A1* | 12/2018 | Suvarna | H01L 29/0847 |
| 2019/0165137 A1 | 5/2019 | Chen | |
| 2019/0252240 A1 | 8/2019 | Lee | |
| 2020/0052094 A1* | 2/2020 | Mochizuki | H01L 27/088 |
| 2020/0176611 A1 | 6/2020 | Lee | |
| 2020/0185278 A1* | 6/2020 | Chang | H01L 27/0924 |

\* cited by examiner

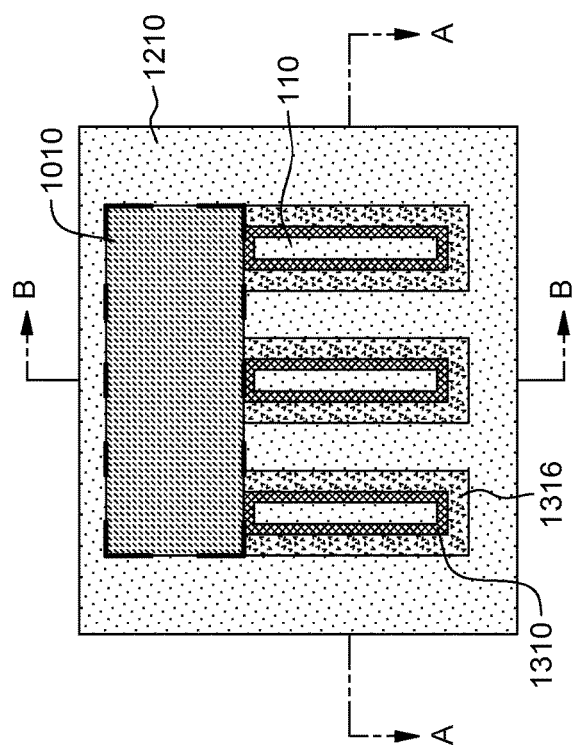
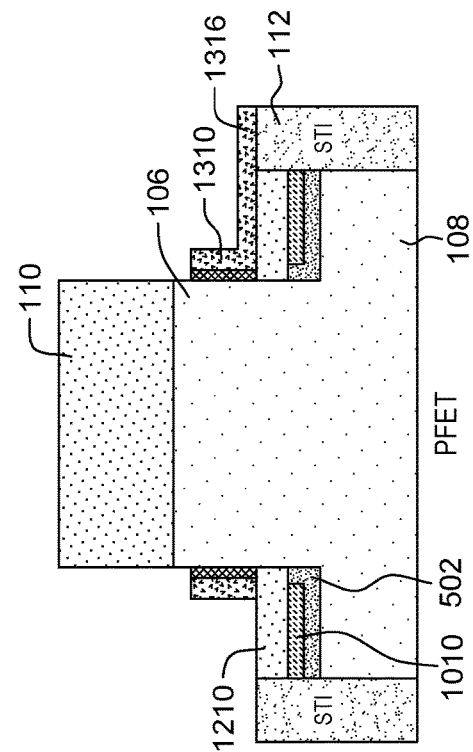
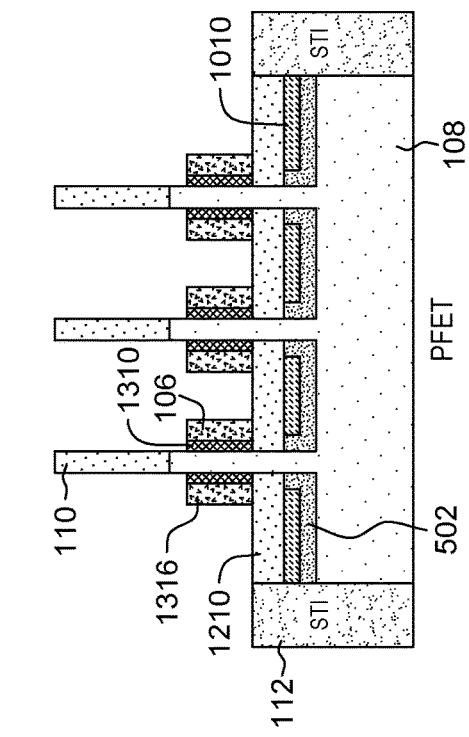

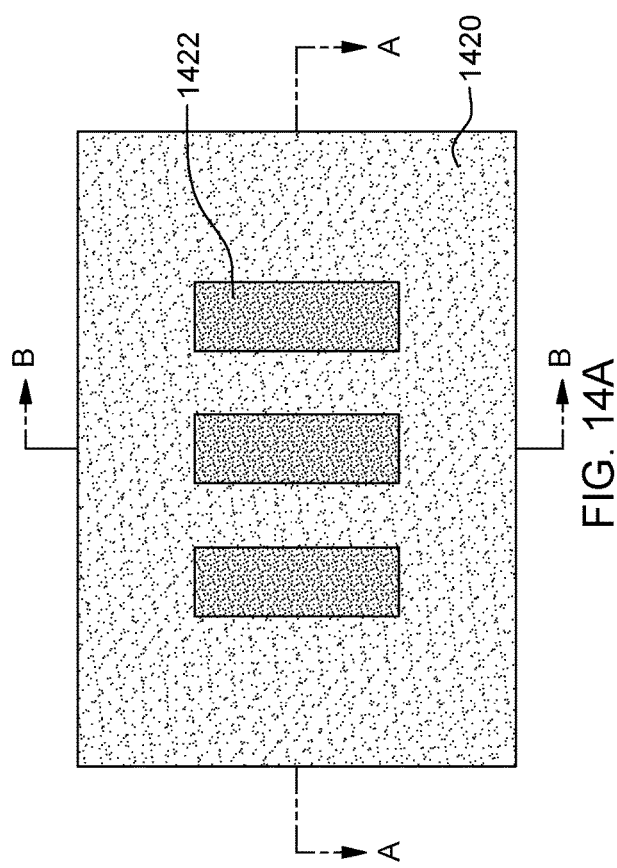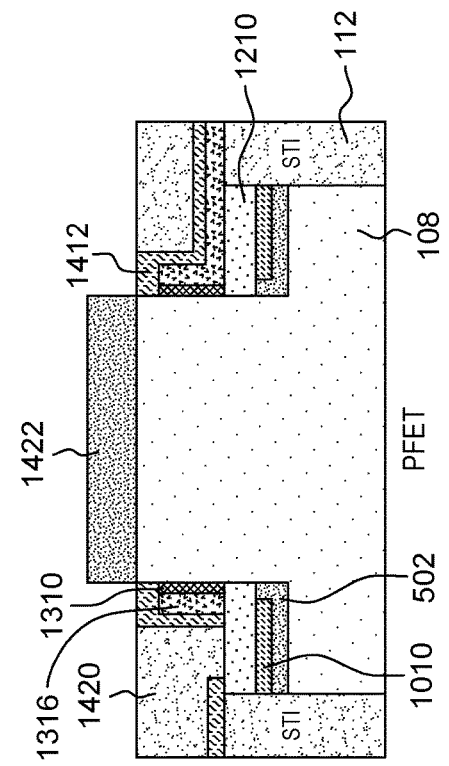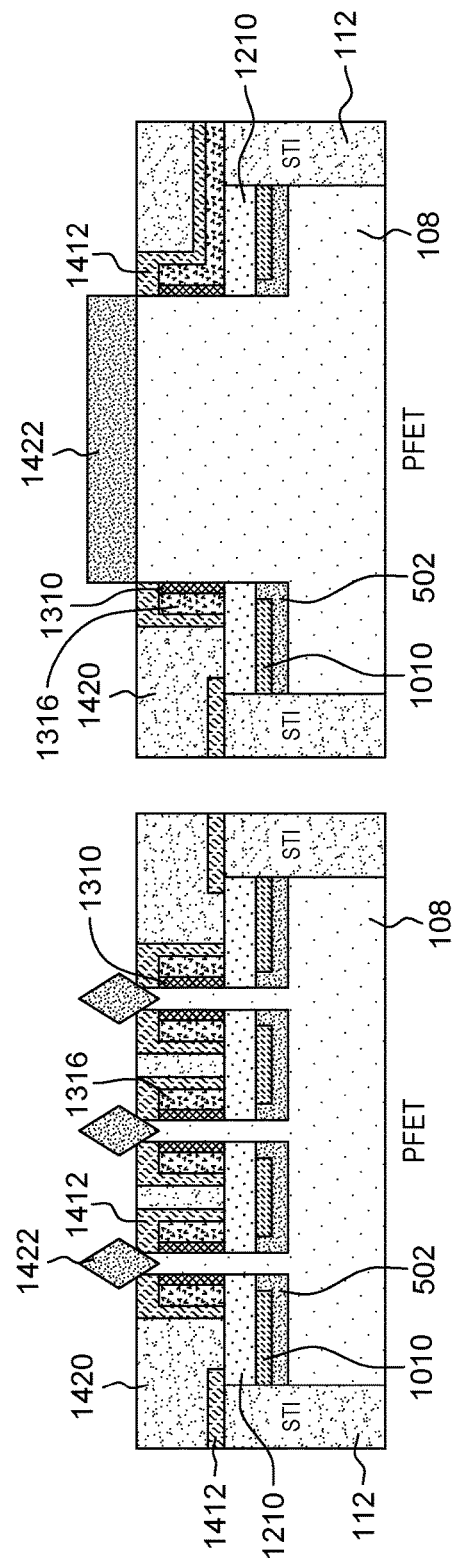

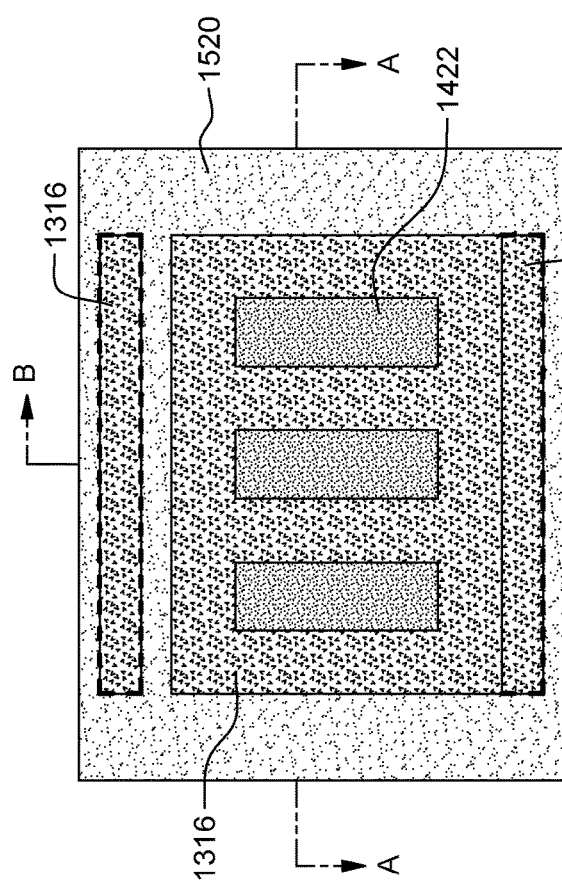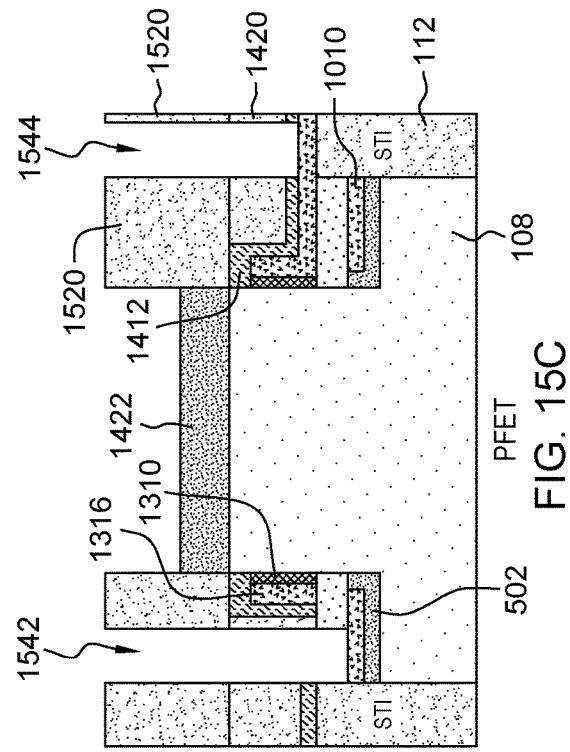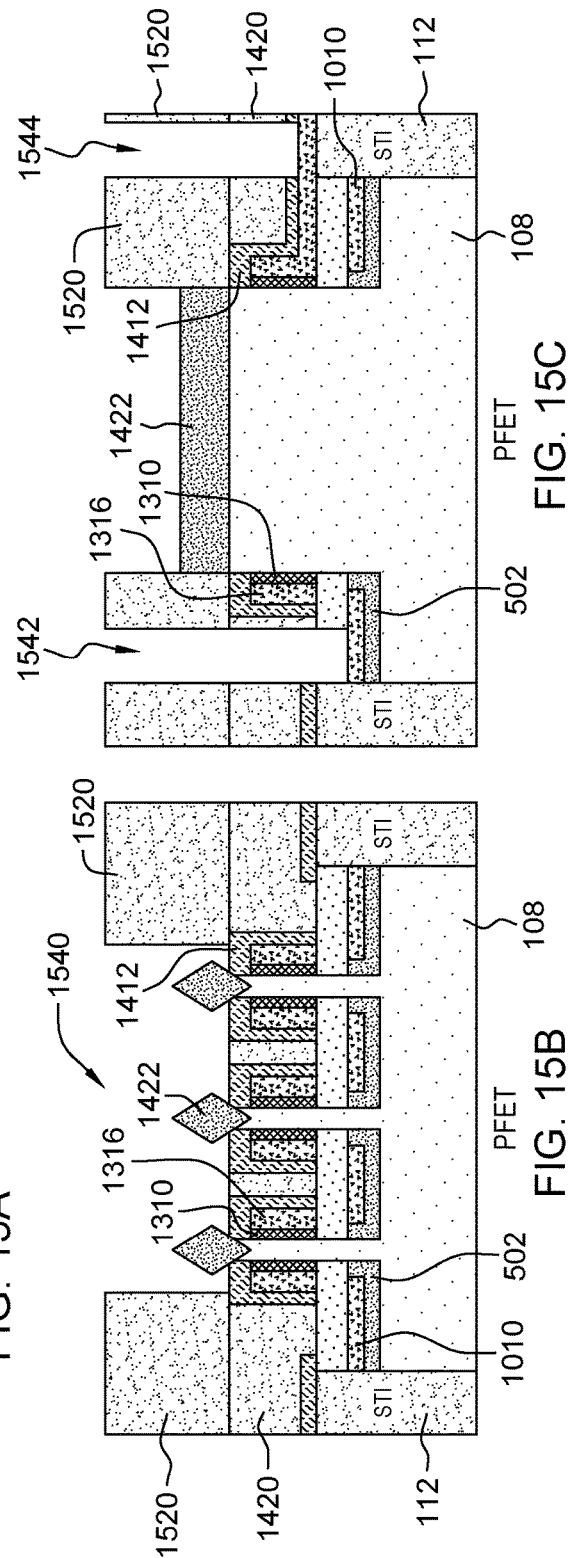

US 12,183,826 B2

VERTICAL FIELD EFFECT TRANSISTOR WITH LOW-RESISTANCE BOTTOM SOURCE-DRAIN CONTACT

BACKGROUND

The present invention generally relates to the field of semiconductor devices, and more particularly to vertical field effect transistors (VFETs).

Field effect transistors (FETs) are typically formed on semiconductor substrates and include a channel region disposed between source and drain regions, and a gate configured to electrically connect the source and drain regions through the channel region. Structures where the channel region is parallel to the main surface of the substrate are referred to as planar FET structures, while structures where the channel region is perpendicular to the main surface of the substrate are referred to as vertical FETs (VFETs). Thus, in a VFET device the direction of the current flow between the source and drain regions is normal (perpendicular) to the main surface of the substrate.

A typical VFET device includes a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls.

SUMMARY

According to an embodiment, a semiconductor structure includes a metal silicide layer containing a bottom surface and sidewalls, the bottom surface and sidewalls of the metal silicide layer being in direct contact with a bottom source/drain region epitaxially grown on a bottom surface of a fin extending upwards from a semiconductor substrate.

According to another embodiment, a semiconductor structure includes a fin extending upward from a substrate, a bottom epitaxially grown source/drain region in direct contact with the substrate and a bottom portion of the fin. A bottom surface and sidewalls of a metal silicide layer are in direct contact with the bottom epitaxially grown source/drain region. A bottom spacer is located above and in direct contact with the metal silicide layer and a portion of the bottom epitaxially grown source/drain region not covered by the metal silicide layer, the bottom spacer surrounding the fin.

BRIEF DESCRIPTION OF THE DRAWINGS

The following detailed description, given by way of example and not intended to limit the invention solely thereto, will best be appreciated in conjunction with the accompanying drawings, in which:

FIG. 13A is a top down view of the PFET region of the semiconductor structure depicting the deposition of a gate metal layer, according to an embodiment of the present disclosure;

FIG. 13B is a cross section view of FIG. 13A taken along section line A-A, according to an embodiment of the present disclosure;

FIG. 13C is a cross section view of FIG. 13A taken along section line B-B, according to an embodiment of the present disclosure;

FIG. 14A is a top down view of the PFET region of the semiconductor structure depicting the formation of a top spacer, a top source/drain region and a first interlevel dielectric layer, according to an embodiment of the present disclosure;

FIG. 14B is a cross section view of FIG. 14A taken along section line A-A, according to an embodiment of the present disclosure;

FIG. 14C is a cross section view of FIG. 14A taken along section line B-B, according to an embodiment of the present disclosure;

FIG. 15A is a top down view of the PFET region of the semiconductor structure depicting the formation of a second interlevel dielectric layer and contact holes, according to an embodiment of the present disclosure;

FIG. 15B is a cross section view of FIG. 15A taken along section line A-A, according to an embodiment of the present disclosure; and FIG. 15C is a cross section view of FIG. 15A taken along section line B-B, according to an embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
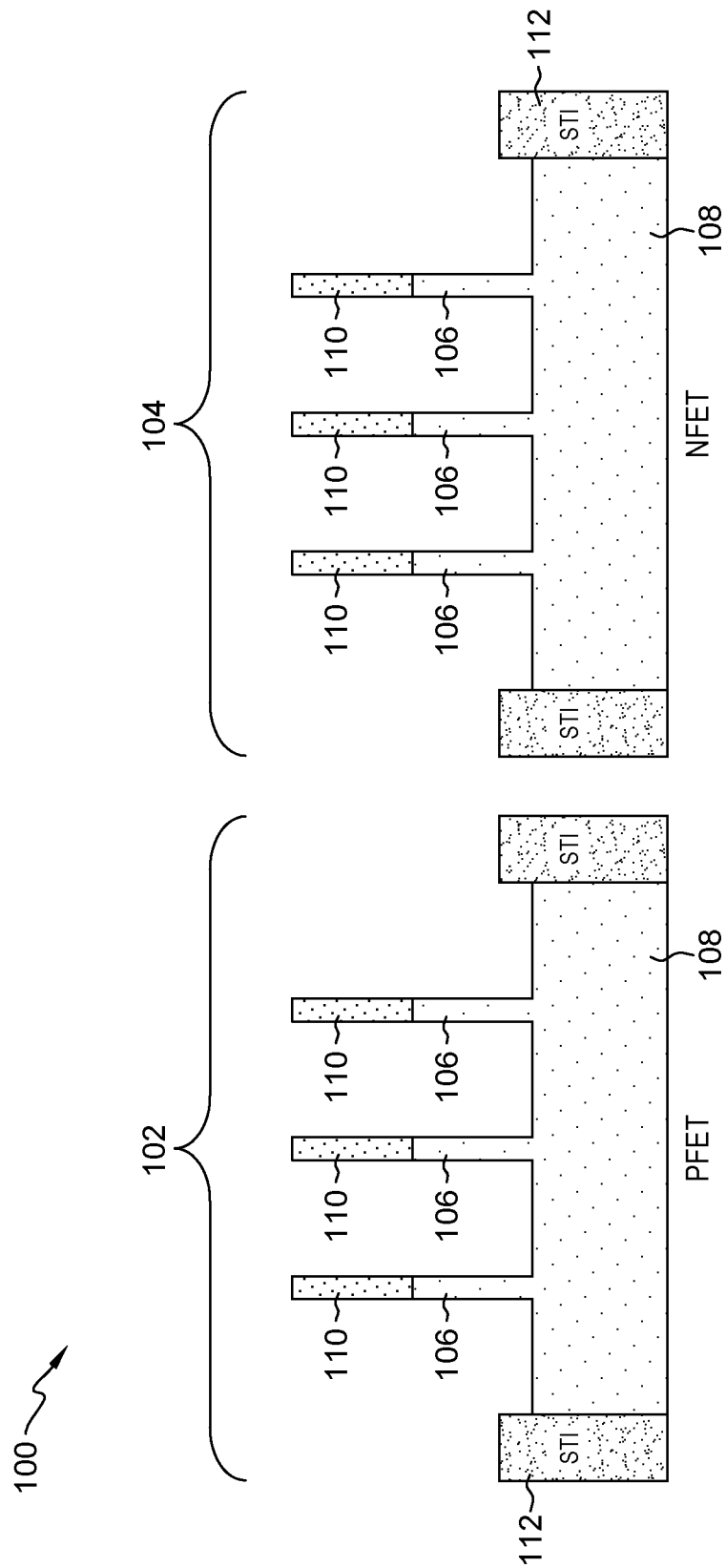
FIG. 1 depicts a semiconductor structure including a PFET region and an NFET region, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

VFET devices generally include a vertical fin extending upward from the substrate which forms the channel region of the transistor. Source and drain regions are formed at the top and bottom ends of the fin (i.e., channel region), while the gate is disposed on the fin sidewalls. Sidewall spacers are formed in contact with the bottom or lower portion of the fins to separate source/drain regions from the gate.

An important design parameter in FETs is the device on-resistance ($R_{ON}$). The on-resistance represents the total resistance between the drain and source regions when the FET is in "on" state. A low source/drain on-resistance is generally desired in semiconductor manufacturing.

An increased bottom source/drain on-resistance has been observed in current VFET architecture as a result of the relatively long distance between source/drain regions and source/drain (metal) contacts. Traditional methods of forming (bottom and top) source/drain regions involve epitaxial growth of doped or undoped semiconductor materials. Low resistivity epitaxy can reduce source/drain on-resistance. However, the resistivity of the bottom source/drain epitaxy cannot be lower than that of the source/drain contact metal.

Therefore, embodiments of the present disclosure describe a method of forming source/drain metal contacts in close proximity to (low resistivity) bottom source/drain epitaxy in order to substantially reduce on-resistance in the VFET device.

The present invention generally relates to the field of semiconductor devices, and more particularly to vertical field effect transistors (VFETs). One way to form bottom source/drain metal contacts in close proximity to bottom source/drain epitaxy includes depositing a metal liner on a semiconductor structure followed by an organic planarization layer (OPL), and etching the metal liner until only portions of the metal liner directly above epitaxially grown bottom source/drain regions remain in the semiconductor structure. One embodiment by which the metal liner may be formed directly above epitaxially grown bottom source/drain regions is described in detailed below by referring to the accompanying drawings in FIGS. 1-15.

Referring now to FIG. 1, a semiconductor structure 100 including a p-channel field effect transistor (PFET) region 102 and an n-channel field effect transistor (NFET) region 104 is shown, according to an embodiment of the present disclosure. In the depicted embodiment, the semiconductor structure 100 is a VFET device. At this step of the manufacturing process, each of the PFET region 102 and NFET region 104 includes a plurality of fin structures 106 (hereinafter "fins") formed from a substrate 108. Embodiments of the present disclosure are applicable to both PFET and NFET devices and/or semiconductor devices having both PFET and NFET regions.

As shown, each of the fins 106 is topped by a hard mask 110. The fins 106 may be formed using sidewall image transfer (SIT) or other suitable techniques. Each of the fins 106 may have a width or horizontal thickness ranging from approximately 5 nanometers (nm) to approximately 10 nm, although other widths above or below this range may be used as desired for a particular application. Each of the fins 106 may have a height or vertical thickness ranging from approximately 30 nm to approximately 150 nm, although other heights above or below this range may also be considered. A spacing between adjacent fins 106 may range between approximately 20 nm to approximately 100 nm.

In some embodiments, the substrate 108 includes a semiconductor substrate formed of silicon (Si), although other suitable materials may be used. For example, the substrate 108 can include any suitable substrate structure, e.g., a bulk semiconductor. The substrate 108 can include a silicon-containing material. Illustrative examples of Si-containing materials suitable for the substrate 108 can include, but are not limited to, silicon (Si), silicon germanium (SiGe) and multi-layers thereof. Although silicon is the predominantly used semiconductor material in wafer fabrication, alternative semiconductor materials can be employed as additional layers, such as, but not limited to, germanium (Ge), gallium arsenide (GaAs), indium gallium arsenide (InGaAs), cadmium telluride (CdTe), zinc selenide (ZnSe), etc. The fins 106 are formed by patterning the substrate 108 as discussed above, and thus may be formed of the same material as the substrate 108.

The substrate 108 may have a width or horizontal thickness selected as desired based on a number of fins 106 or other features to be formed thereon. The substrate 108 may have a height or vertical thickness ranging from approximately 20 nm to approximately 500 nm, although other heights above or below this range may be used as desired for a particular application.

The hard mask 110 may be initially formed over a top surface of the entire substrate 108, followed by patterning using SIT or other suitable techniques, with the fins 106 being formed by etching portions of the substrate 108 exposed by the patterned hard mask 110. The hard mask 110 may be formed of silicon nitride (SiN), although other suitable materials such as silicon oxide (SiOX), silicon dioxide (SiO2) and silicon oxynitride (SiON) may be used. The hard mask 110 may have a height or vertical thickness ranging between approximately 20 nm to approximately 100 nm, although other heights above or below this range may be used as required for a particular application.

The substrate 108 may further include shallow trench isolation (STI) regions 112. STI regions 112 are frequently used in semiconductor technology to separate active regions within the substrate 108 and prevent electric current leakage between adjacent components. The process of forming the STI regions 112 is well known in the art, and generally include etching the substrate 108 to create recesses that may later be filled with an insulator material using any deposition method known in the art. The isolation regions 112 may consist of any low-k dielectric material including, but not limited to: silicon nitride, silicon oxide, silicon oxy-nitride and fluoride-doped silicate glass.

Figure 2:
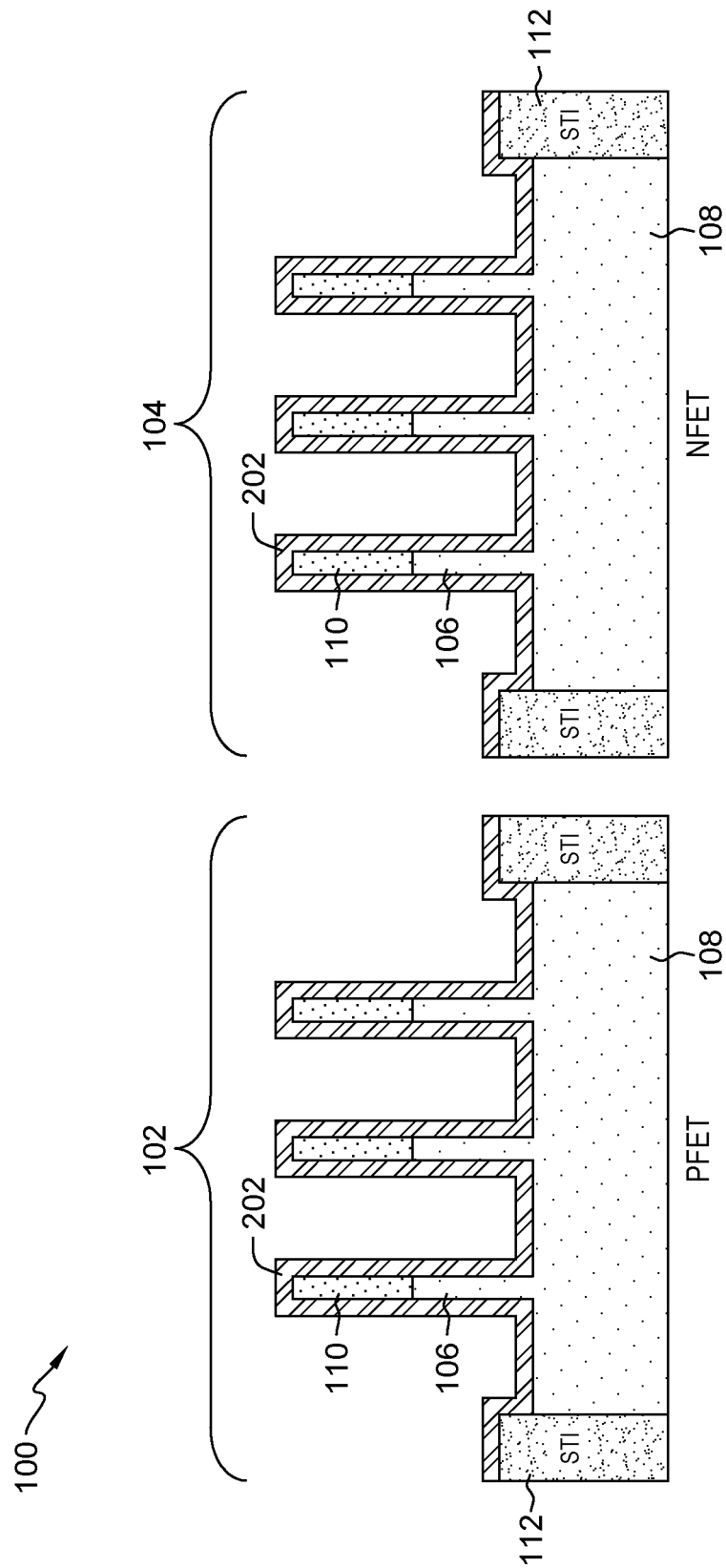
FIG. 2 depicts forming a fin spacer on the semiconductor structure, according to an embodiment of the present disclosure.

Referring now to FIG. 2, a fin spacer 202 is formed on the semiconductor structure 100, according to an embodiment of the present disclosure. More specifically, the fin spacer 202 may be conformally deposited above and in direct contact with the substrate 108, the fins 106, the hard mask 110, and STI regions 112. Stated differently, the fin spacer 202 may be formed along a perimeter formed by top surfaces of the substrate 108, top surface and sidewalls of the STI regions 112, and sidewalls of the fins 106 and hard mask 110. The fin spacer 202 may function as a protective barrier to preserve the fins 106 and hard mask 110 during subsequent manufacturing steps.

The fin spacer 202 may include a dielectric material such as silicon oxide, silicon nitride, silicon oxynitride, a low-k material, or any combination thereof. The fin spacer 202 may be formed by any suitable deposition method known in the art. According to an embodiment, the fin spacer 202 may include silicon nitride (SiN). According to another embodiment, the fin spacer 202 may include a silicon nitride (SiN)/silicon dioxide ($SiO_2$) bilayer.

Typically, the fin spacer 202 may have a thickness ranging from approximately 2 nm to approximately 12 nm. In an embodiment, the fin spacer 202 may have a thickness ranging from approximately 4 nm to approximately 6 nm.

Figure 3:
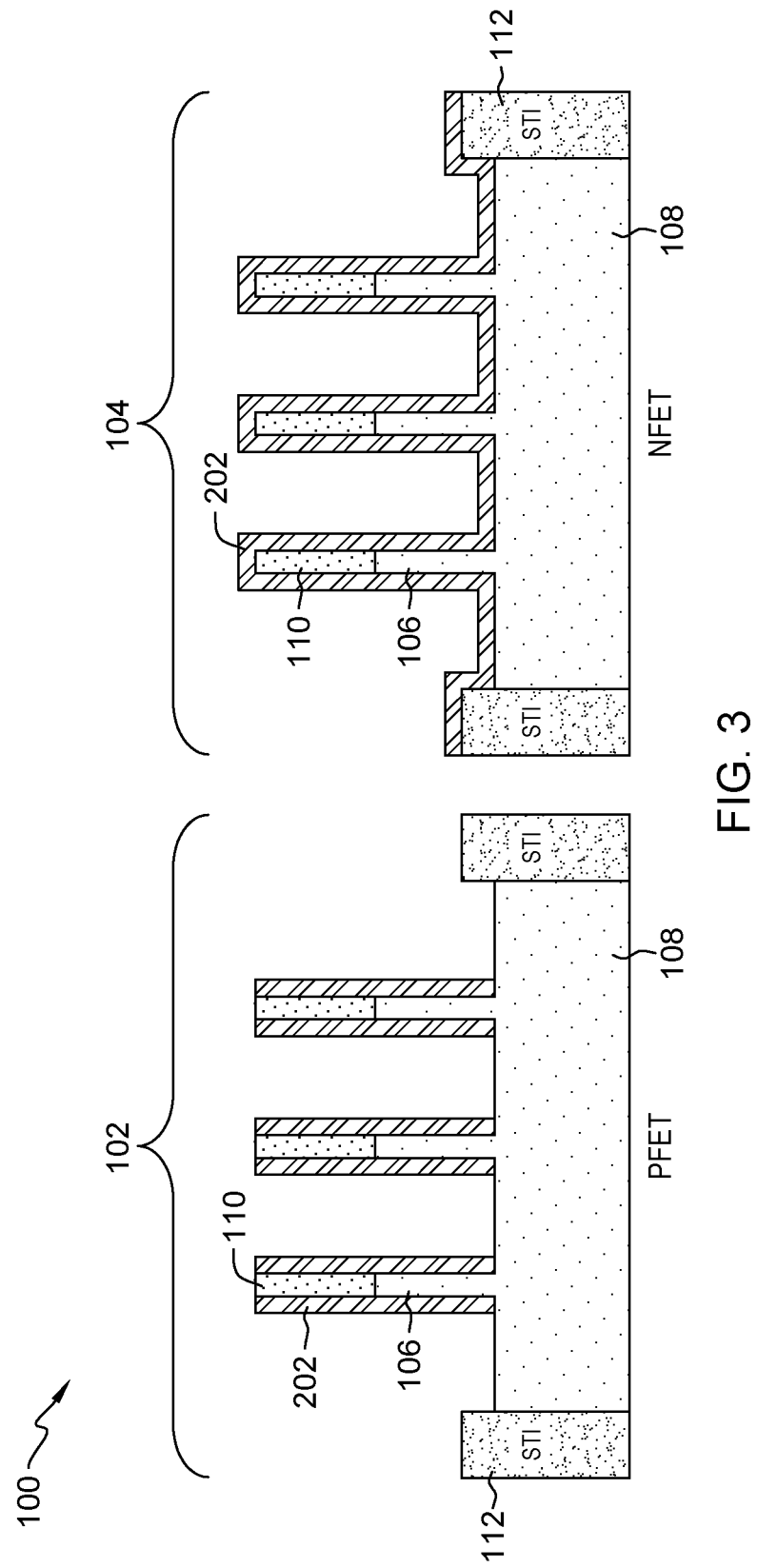
FIG. 3 depicts removing top and bottom portions of the fin spacer from the PFET region, according to an embodiment of the present disclosure.

Referring now to FIG. 3, top and bottom portions of the fin spacer 202 are removed from the PFET region 102, according to an embodiment of the present disclosure. As may be understood by those skilled in the art, the NFET region 104 is covered with a mask (not shown) while top and bottom portions of the fin spacer 202 are removed from the (uncovered) PFET region 102.

More specifically, portions of the fin spacer 202 parallel to the substrate 108 and STI regions 112 are removed from the semiconductor structure 100. According to an embodiment, an anisotropic etching technique may be used to remove the top and bottom portions of the fin spacer 202. By performing an anisotropic etch, the fin spacer 202 may be selectively removed from top surfaces of the substrate 108, hardmask 110 and STI regions 112 only, while remaining on opposite sidewalls of the fins 106 and hard mask 110. For example, a top down reactive ion etching (RIE) process, typically known as spacer RIE, can be conducted to remove the fin spacer 202.

Figure 4:
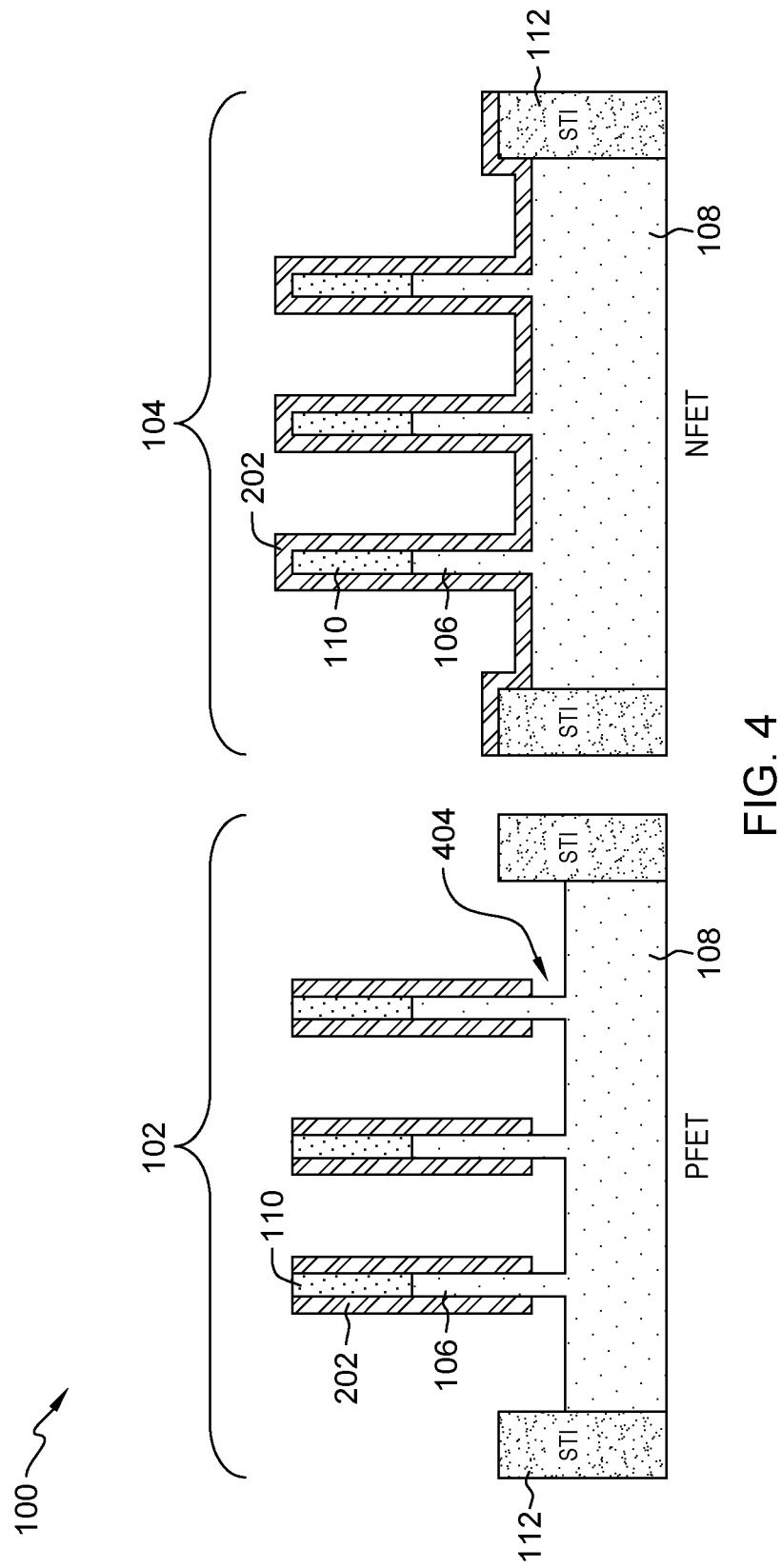
FIG. 4 depicts recessing a substrate in the PFET region, according to an embodiment of the present disclosure.

Referring now to FIG. 4, the substrate 108 in the (uncovered) PFET region 102 is recessed, according to an embodiment of the present disclosure. As shown in the figure, by recessing the substrate 108, bottom portions of the fins 106 are exposed allowing the subsequent formation of bottom source/drain regions in the PFET region 102, as will be described in detail below. Stated differently, after recessing the substrate 108, an opening 404 is formed between a bottom surface of the fin spacer 202 and a top surface of the recessed substrate 108, the opening 404 surrounds the bottom portions of the fins 106 exposing sidewalls of the fins 106. Any suitable etching technique may be used to recess the substrate 108. According to an embodiment, a top down RIE process can be used to recess the substrate 108.

Figure 5:
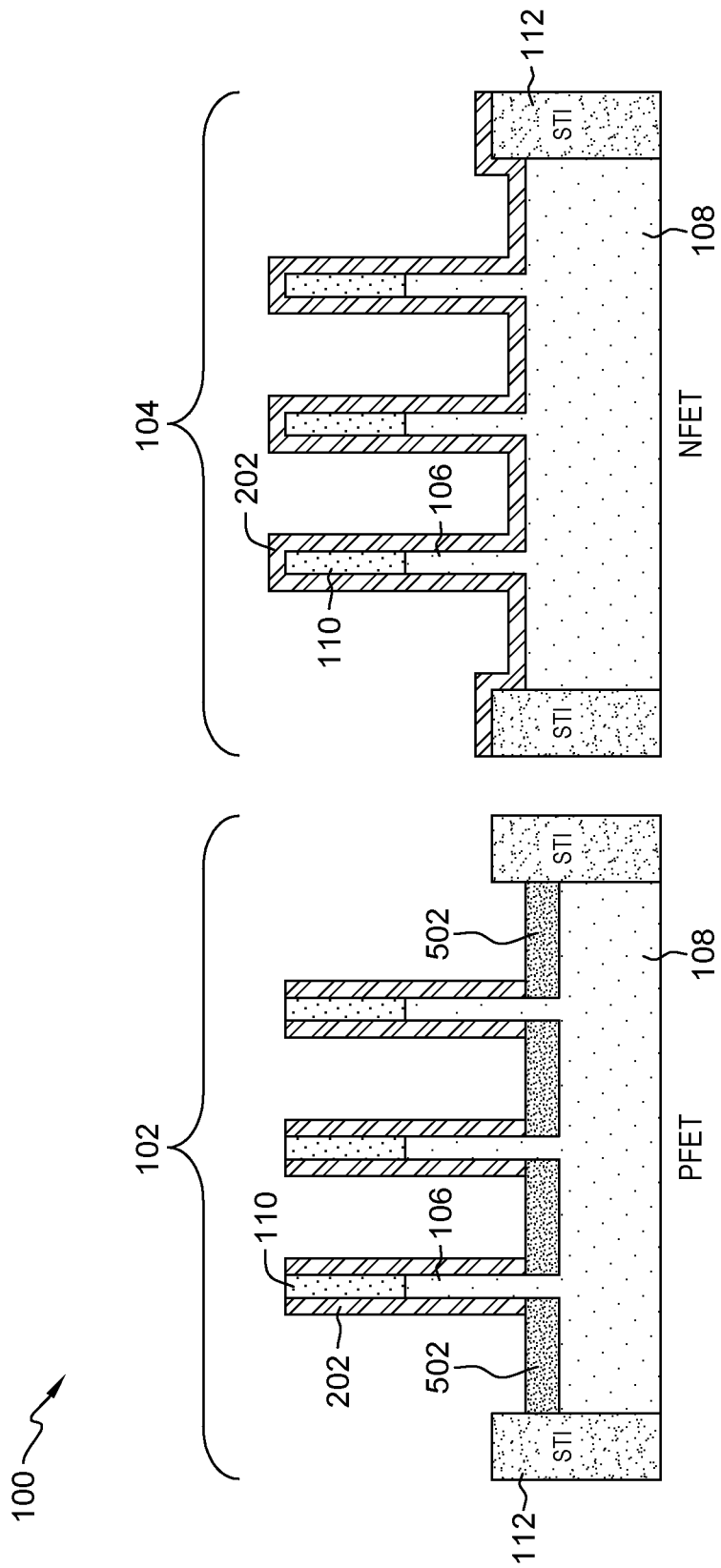
FIG. 5 depicts forming a bottom source/drain region in the PFET region, according to an embodiment of the present disclosure.

Referring now to FIG. 5, a bottom source/drain region 502 is formed in the PFET region 102 around the exposed portions of the fins 106, according to an embodiment of the present disclosure. After recessing portions of the substrate 108, the bottom source/drain region 502 is formed in the opening 404 depicted in FIG. 4. The bottom source/drain region 502 can be formed by bottom-up epitaxial growth processes (with dummy vertical dielectric liners covering fin sidewalls during epitaxial growth). It should be noted that the bottom source/drain region in the PFET region 102 (e.g., bottom source/drain region 502) and the bottom source/drain region in the NFET region 104 (e.g., bottom source/drain region 602 in FIG. 6) are grown in separate epitaxial processes to certain height (thickness). According to an embodiment, the bottom source/drain region 502 is grown until the height of the epitaxial material substantially fills the opening 404 (FIG. 4). In some instances, the bottom source/drain region 502 may have a height or vertical thickness ranging from approximately 50 nm to approximately 100 nm.

The epitaxially grown bottom source/drain region 502 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, a p-type dopant selected from a group of boron (B), gallium (Ga), indium (In), and thallium (Tl) at various concentrations. In a non-limiting example, a p-type dopant concentration range may be $2 \times 10^{20}/cm^3$ to $3 \times 10^{21}/cm^3$. According to an embodiment, the bottom source/drain region 502 includes boron doped SiGe.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different precursors may be used for the epitaxial growth of the bottom source/drain region 502. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 6:
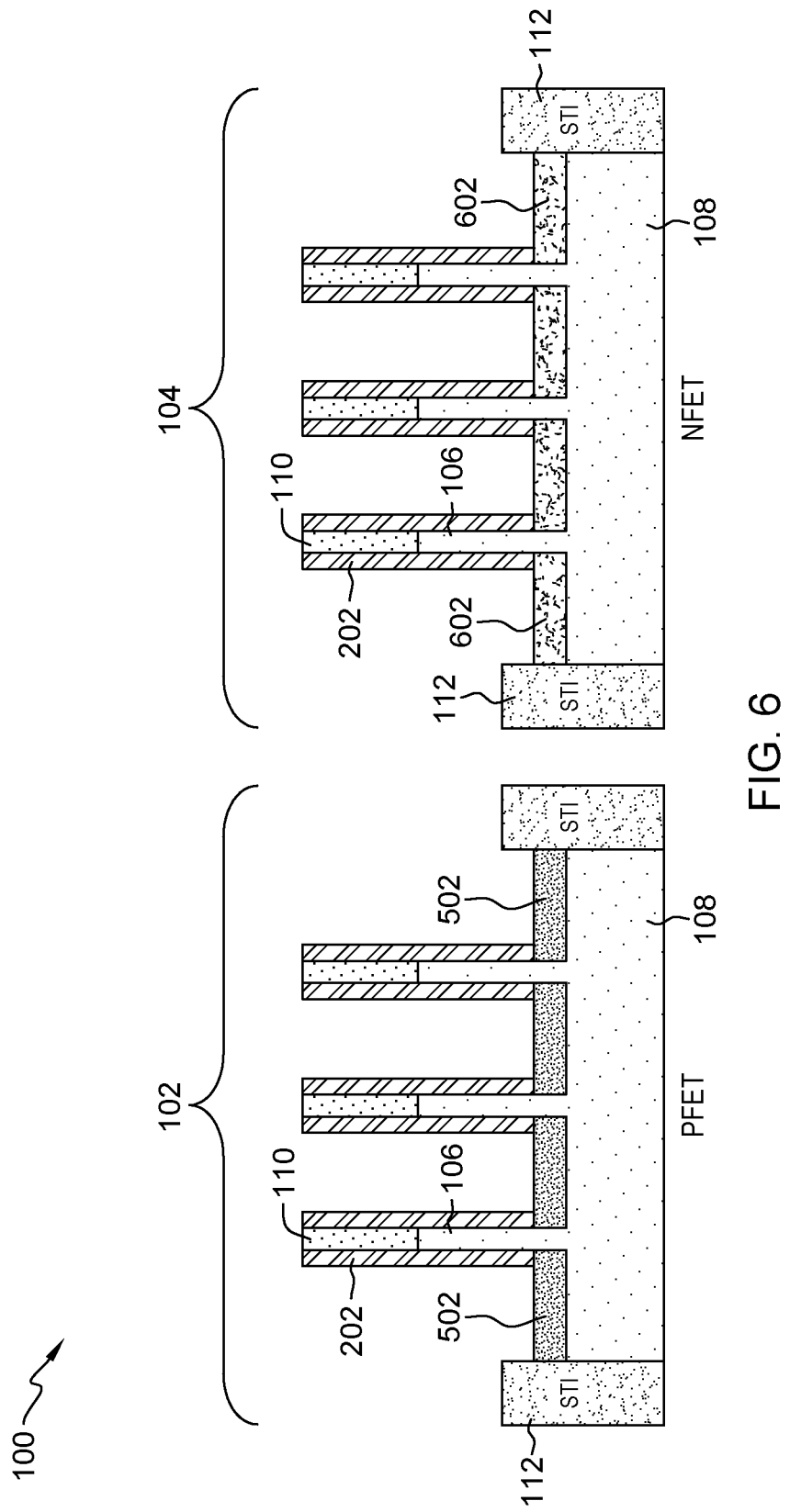
FIG. 6 depicts forming a bottom source/drain region in the NFET region, according to an embodiment of the present disclosure.

Referring now to FIG. 6, a bottom source/drain region 602 is formed in the NFET region 104 around the fins 106, according to an embodiment of the present disclosure. Similar to the bottom source/drain region 502 formed in the PFET region 102, the bottom source/drain region 602 is formed after removing top and bottom portions of the fin spacer 202 and recessing top portions of the substrate 108 in the NFET region 104. As may be understood by those skilled in the art, after formation of the bottom source/drain region 502, the PFET region 102 is covered with a mask (not shown) while the NFET region 104 is uncovered to form the bottom source/drain region 602.

As the bottom source/drain region 502, the bottom source/drain region 602 is formed by bottom-up epitaxial growth processes until a thickness of the bottom source/drain region 602 is substantially equal to a thickness of the previously formed bottom source/drain regions 502. The epitaxially grown bottom source/drain region 602 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb). In a non-limiting example, an n-type dopant concentration range may be $2\times10^{20}/cm^3$ to $3\times10^{21}/cm^3$. According to an embodiment, the bottom source/drain region 602 includes phosphorous doped silicon.

Figure 7:
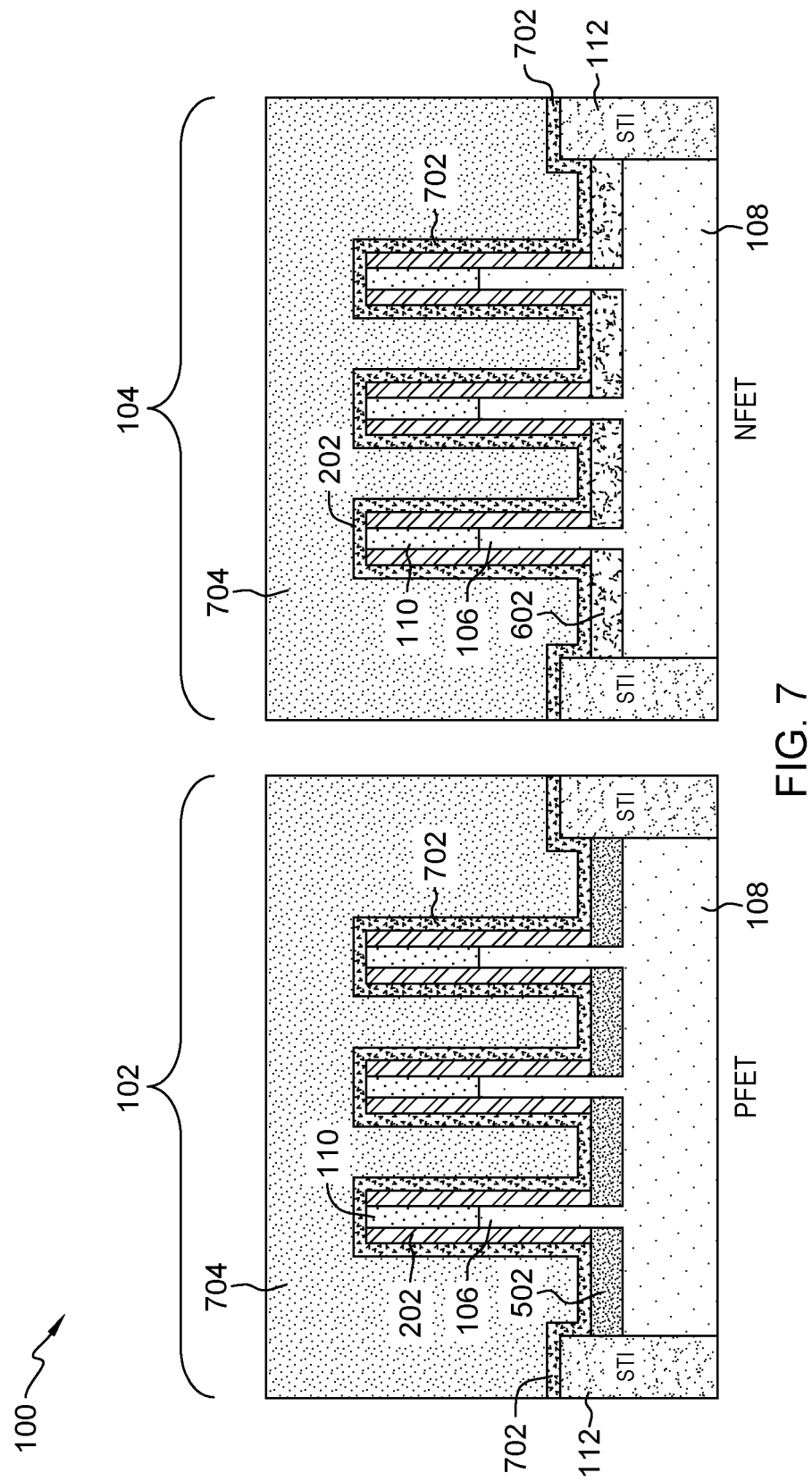
FIG. 7 depicts forming a metal liner and an organic planarization layer on the PFET and NFET regions, according to an embodiment of the present disclosure.

Referring now to FIG. 7, a metal liner 702 is formed on the PFET and NFET regions 102, 104 of the semiconductor structure 100 followed by an organic planarization layer (OPL) 704, according to an embodiment of the present disclosure. At this point of the manufacturing process, the PFET and NFET regions 102,104 have been uncovered, and formation of the metal liner 702 and OPL 704 may occur simultaneously in both the PFET and NFET regions 102, 104.

According to an embodiment, the metal liner 702 includes a material such as titanium (Ti). Formation of the metal liner 702 allows the formation of a metal silicide and its corresponding bottom source/drain metal contact(s) in close proximity to the bottom source/drain regions 502, 602. This may in turn reduce the on-resistance of the semiconductor structure 100, as will be described in detail below.

The metal liner 702 is conformally deposited on the PFET and NFET regions 102, 104 of the semiconductor structure 100, above and in direct contact with the STI regions 112, source/drain regions 502, source/drain region 602, hard mask 110, and fin spacer 202. The metal liner 702 may be formed by any suitable deposition technique, for example, atomic layer deposition (ALD). According to an embodiment, a thickness of the metal liner 702 may vary from approximately 5 nm to approximately 20 nm.

Subsequently, the OPL 704 is formed directly above the metal liner 702. The OPL 704 may include any OPL material capable of effectively preventing damage of underlying layers (e.g., the metal liner 702) during subsequent etching processes. The OPL 704 may include, but is not necessarily limited to, an organic polymer including C, H, and N. According to an embodiment, the OPL material can be free of silicon (Si). According to another embodiment, the OPL material can be free of Si and fluorine (F). As defined herein, a material is free of an atomic element when the level of the atomic element in the material is at or below a trace level detectable with analytic methods available in the art. Non-limiting examples of the OPL material forming the OPL 704 may include JSR HM8006, JSR HM8014, AZ UM10M2, Shin Etsu ODL 102, or other similar commercially available materials. The OPL 704 may be deposited, for example, by spin coating, followed by a planarization process, such as, for example, chemical mechanical polishing (CMP).

It should be noted that in embodiments in which the fin spacer 202 includes a silicon nitride/silicon oxide bilayer, deposition of the OPL 704 above the metal liner 702 may not be necessary, and a salicide process can be performed to form metal silicide contacts.

Figure 8:
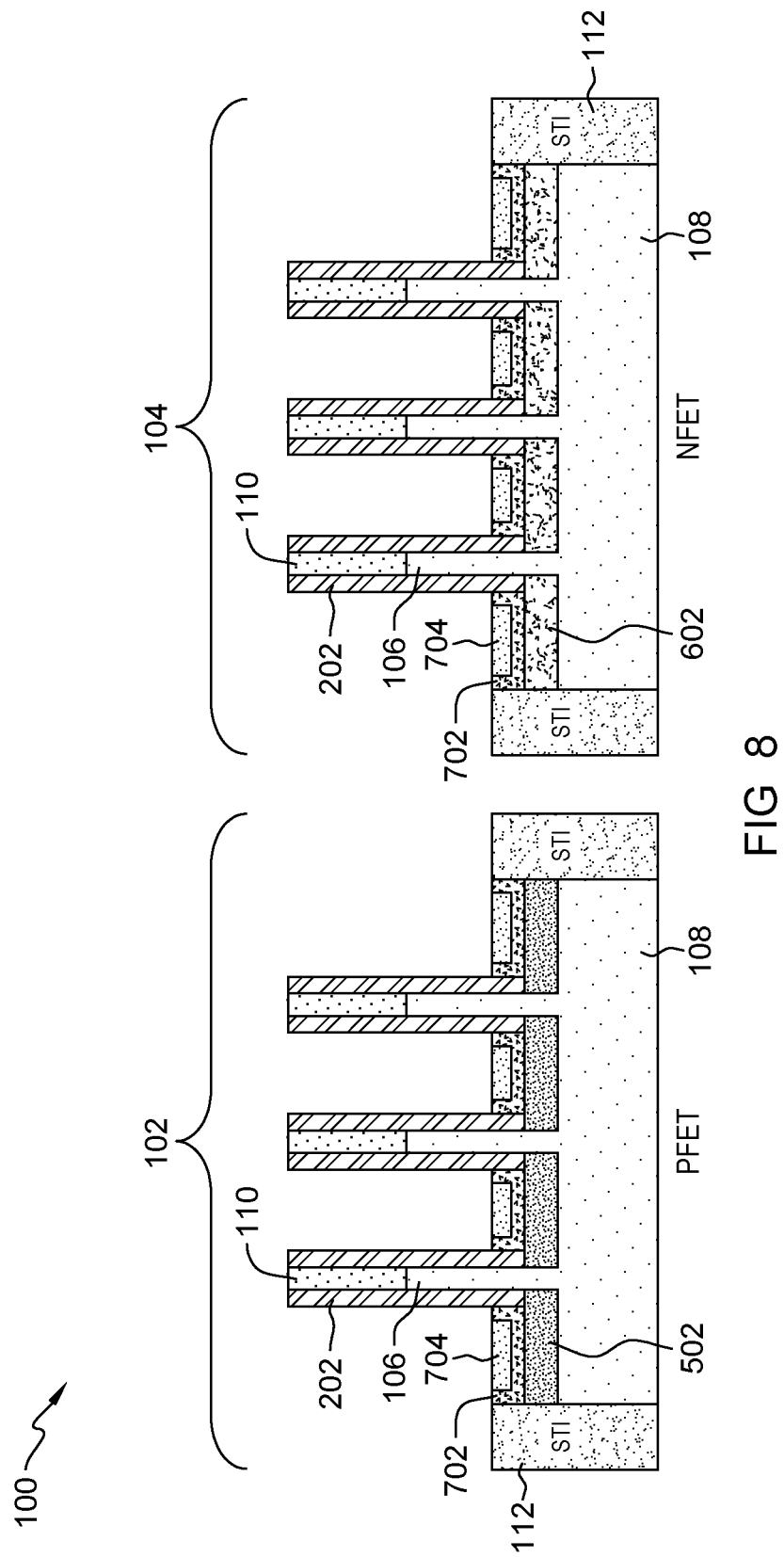
FIG. 8 depicts recessing the metal liner and organic planarization layer, according to an embodiment of the present disclosure.

Referring now to FIG. 8, the OPL 704 and metal liner 702 are recessed, according to an embodiment of the present disclosure. In some embodiments, recessing of the OPL 704 and metal liner 702 involves a two-step process. For example, an OPL RIE including a trace point detection is conducted to recess the OPL 704 until a top portion of the metal liner 702 above the hard mask 110 is reached. Then, the process continues with a time etch technique that allows simultaneously recessing the OPL 704 and metal liner 702 until a (vertical) height of remaining portions of the OPL 704 and metal liner 702 is substantially the same as a height of the STI regions 112, as depicted in the figure. Stated differently, recessing of the OPL 704 and metal liner 702 is conducted until top surfaces of the recessed OPL 704 and metal liner 702 are substantially coplanar with a top surface of the STI regions 112. According to an embodiment, the OPL 704 allows for better depth controllability during the process of recessing the metal liner 702.

Figure 9:
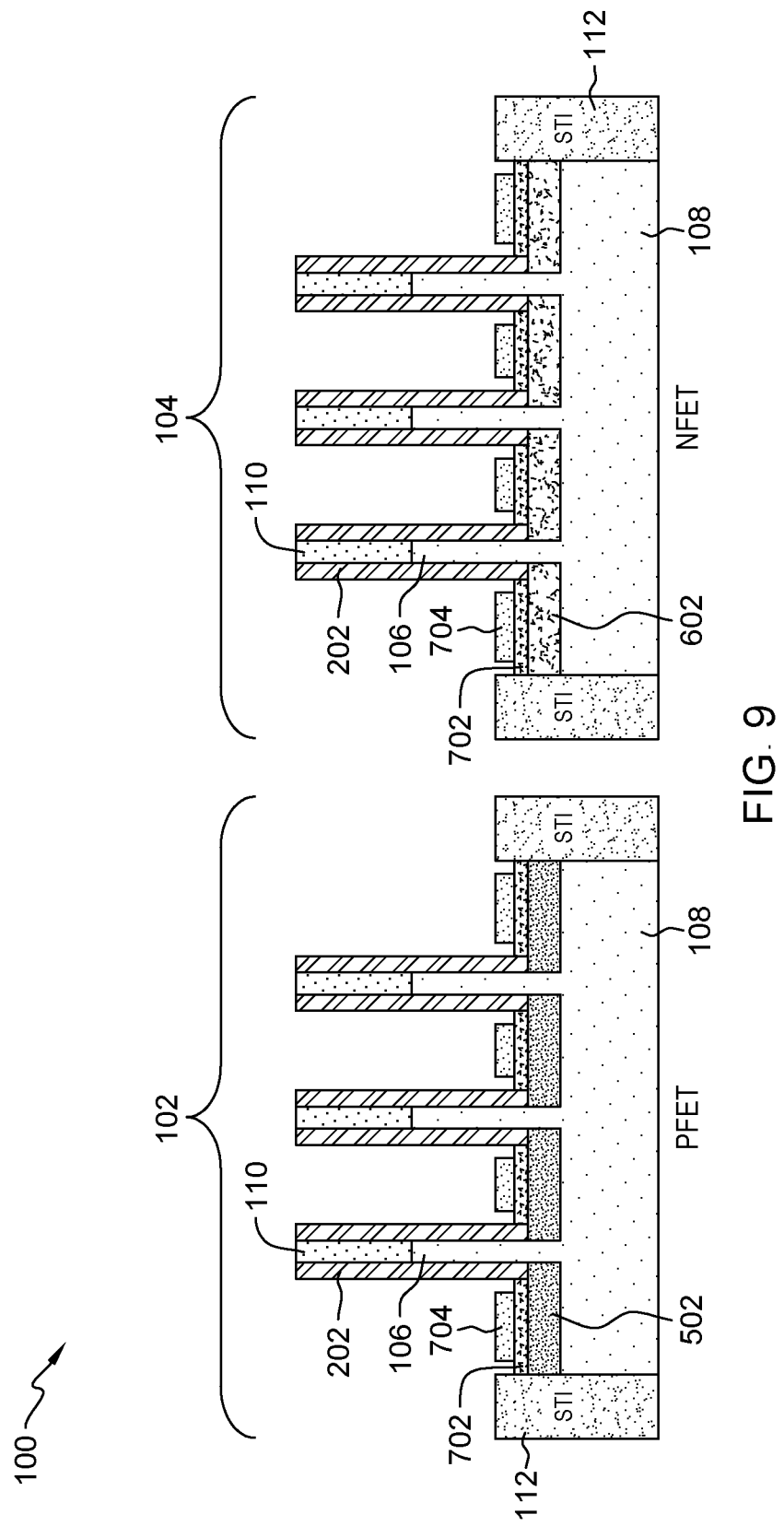
FIG. 9 depicts removing portions of the metal liner from the semiconductor structure, according to an embodiment of the present disclosure.

Referring now to FIG. 9, portions of the metal liner 702 are removed from the semiconductor structure 100, according to an embodiment of the present disclosure. Specifically, in this embodiment, portions of the metal liner 702 perpendicular to the source/drain regions 502, 602 are removed from the semiconductor structure 100, as shown in the figure. By performing this step, only portions of the titanium liner 702 parallel to the source/drain regions 502, 602 remain in the semiconductor structure 100. A directional etching technique may be used to remove portions of the metal liner 702 perpendicular to the source/drain regions 502, 602. In an embodiment, RIE or a wet etching process can be used to remove such portions of the metal liner 702. As can be observed, a portion of the OPL 704 remains on top of the titanium liner 702.

Figure 10:
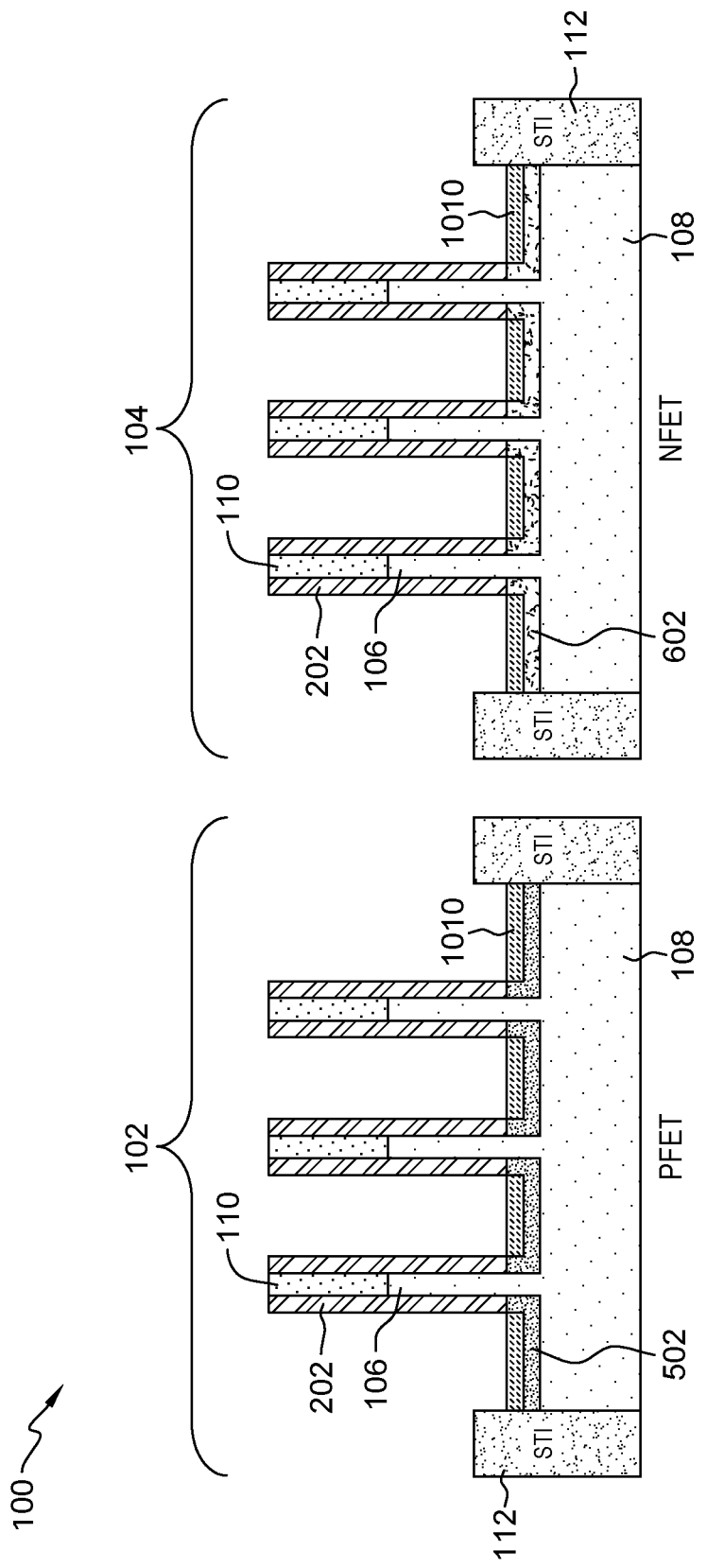
FIG. 10 depicts removing the organic planarization layer from the semiconductor structure, according to an embodiment of the present disclosure.

Referring now to FIG. 10, the remaining portion of the OPL 704 is removed from the semiconductor structure 100, according to an embodiment of the present disclosure. Specifically, the OPL 704 is removed from above the metal liner 702 (FIG. 9) using, for example, oxygen plasma, nitrogen plasma, hydrogen plasma or other carbon strip or ashing process, which causes minimal or no damage to the underlying layers.

Following the removal of the OPL 704, a high temperature anneal is performed on the semiconductor structure 100 to form a metal silicide layer 1010 on the source/drain regions 502, 602. It should be noted that, in this embodiment, wet or mildly wet strip to remove unreacted metals (e.g., titanium from the metal liner 702) is not performed prior to the high temperature anneal in order to promote the formation of a thicker metal silicide layer 1010. By forming a thicker silicide layer 1010, migration of the silicide material during downstream high temperature processes may be prevented, particularly during replacement module gate (RMG) reliability anneal. A thickness of the metal silicide layer 1010 may vary from approximately 4 nm to approximately 10 nm.

According to an embodiment, the semiconductor structure 100 is subjected to a high temperature anneal process, using conventional processes, such as rapid thermal annealing (RTA). During the thermal annealing process, the metal liner 702 (FIG. 9) reacts with the silicon present in the source/drain regions 502, 602 to form the metal silicide layer 1010. The annealing temperature may vary from approximately 400° C. to approximately 900° C., although other temperatures above or below this range may also be considered.

After the thermal annealing, an etching process may be carried out to remove substantially all unreacted metal or metal alloys. The etching process may include a wet etching method.

Figure 11:
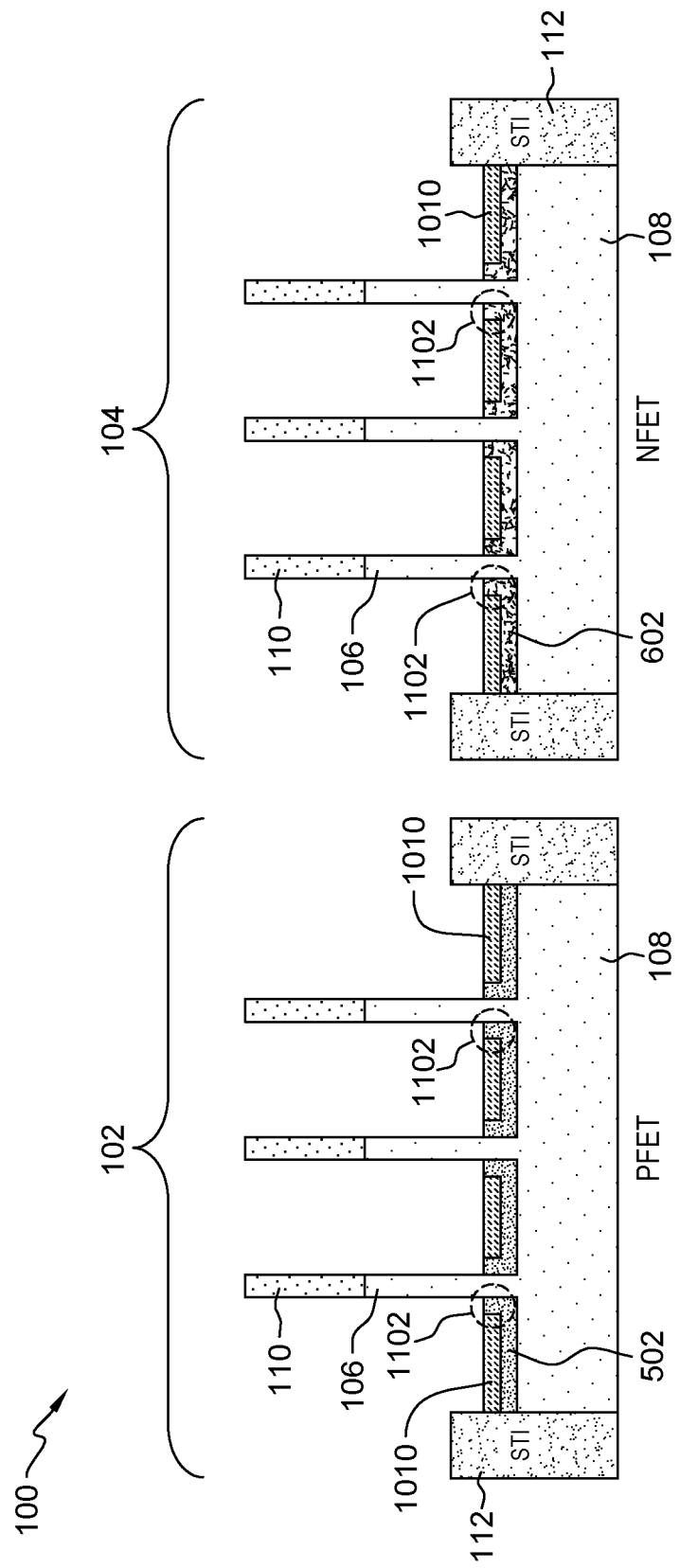
FIG. 11 depicts removing the fin spacer from the semiconductor structure, according to an embodiment of the present disclosure.

Referring now to FIG. 11, the fin spacer 202 is removed from the semiconductor structure 100, according to an embodiment of the present disclosure. Removal of the fin spacer 202 from sidewalls of the fins 106 and hard mask 110 can be performed by any suitable etching technique such as, for example, wet chemical etching and cleaning.

It should be noted that an epitaxial region 1102 remains between the (undoped) fins 106 and the metal silicide layer 1010. The epitaxial region 1102 prevents the metal silicide layer 1010 to contact the fins 106, but still allows subsequently formed metal contacts to be in close proximity to the source/drain epitaxy. This may in turn help reducing on-resistance (Rory) in bottom source/drain contacts.

Figure 12:
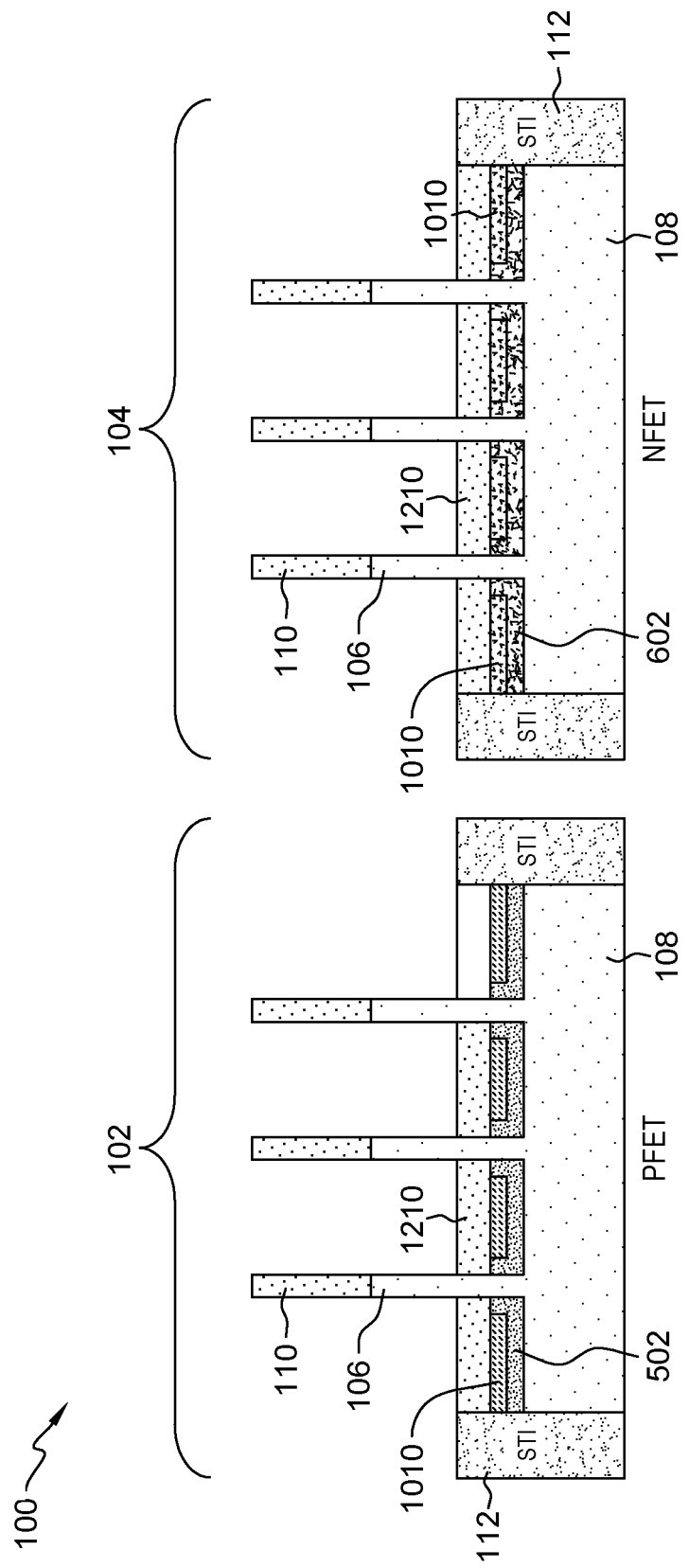
FIG. 12 depicts forming a bottom spacer in the semiconductor structure, according to an embodiment of the present disclosure.

Referring now to FIG. 12, a bottom spacer 1210 is formed in the semiconductor structure 100, according to an embodiment of the present disclosure. The bottom spacer 1210 is formed above and in direct contact with the source/drain regions 502, 602 using non-conformal deposition and etch-back processing (e.g., physical vapor deposition (PVD), high density plasma (HDP) deposition, etc.). Non-limiting examples of materials for forming the bottom spacer 1210 may include SiO2, SiN, silicon carbide oxide (SiCO), silicon boron carbide nitride (SiBCN) and/or other like materials. The bottom spacer 1210 may have a (vertical) thickness ranging from approximately 3 nm to approximately 10 nm, although other thicknesses above or below this range may be used as desired for a particular application.

Referring now to FIGS. 13A-13B, a gate metal layer 1316 is deposited on a gate dielectric layer 1310, according to an embodiment of the present disclosure. In this embodiment, the gate metal and gate dielectric layers 1316, 1310 are deposited directly above the bottom spacer 1210 surrounding the fins 106. For illustration purposes only, without intent of limitation, subsequent processing steps will be described only with reference to the PFET region 102 of the semiconductor structure 100. As may be understood by those skilled in the art, at this step of the manufacturing process the NFET region 104 may be covered with a mask (not shown), and then uncovered to perform processing steps similar to those described herein with respect to the PFET region 102. In this embodiment, FIG. 13A is a top view of the PFET region 102, FIG. 13B is a cross-sectional view of FIG. 13A taken along section line A-A (e.g., across fins 106) and FIG. 13C is a cross-sectional view of FIG. 13A taken along section line B-B (e.g., along fins 106).

According to an embodiment, the gate dielectric layer 1310 may be formed in direct contact with the fins 106 by any suitable deposition method known in the art, including, for example, chemical vapor deposition (CVD), plasma-assisted CVD, atomic layer deposition (ALD), evaporation, reactive sputtering, chemical solution deposition or other like deposition processes. Generally, the gate dielectric layer 1310 includes a high-k material including, but not limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). A thickness of the gate dielectric layer 1310 may vary, but typically may have a (horizontal) thickness ranging from approximately 1 nm to approximately 3 nm.

The gate metal layer 1316 may be formed in direct contact with the gate dielectric layer 1310, and may include a p-type work function metal deposited using, for example, deposition techniques including, but not limited to, CVD, PECVD, RFCVD, PVD, ALD, MLD, MBD, PLD, LSMCD, sputtering, and/or plating. The p-type work function metal forming the gate metal layer 1316 may include, for example, titanium nitride (TiN), tantalum nitride (TaN) or ruthenium (Ru). A thickness of the gate metal layer 1316 may vary, but typically may have a (horizontal) thickness ranging from approximately 4 nm to approximately 20 nm.

During subsequent processing steps conducted in the NFET region (not shown), a gate metal layer, such as the gate metal layer 1316, is formed by depositing an n-type work function metal. The n-type work function metal may include, for example, TiN, titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN.

Referring now to FIGS. 14A-14C, a top spacer 1412 is formed on the PFET region 102 of the semiconductor structure 100, according to an embodiment of the present disclosure. In this embodiment, FIG. 14A is a top view of the PFET region 102, FIG. 14B is a cross-sectional view of FIG. 14A taken along section line A-A (e.g., across fins 106) and FIG. 14C is a cross-sectional view of FIG. 14A taken along section line B-B (e.g., along fins 106).

The top spacer 1412 is conformally deposited above and in direct contact with the gate metal layer 1316, hard mask 110 (FIG. 13), bottom spacer 1210 and STI regions 112. In this embodiment, the top spacer 1412 may be deposited using, for example, CVD, PECVD, RFCVD, PVD, ALD, MLD, MBD, PLD, LSMCD, sputtering, and/or plating. Non-limiting examples of materials forming the top spacer 1412 may include silicon nitride (SiN), silicon boron nitride (SiBN), siliconborocarbonitride (SiBCN), or silicon oxycarbonitride (SiOCN). Any suitable etching technique (e.g., RIE) may be used to remove the top spacer 1412 from top surfaces of the bottom spacer 1210, as depicted in the figure, prior to deposition of a first interlevel dielectric (ILD) layer 1420.

The first ILD layer 1420 is formed on the PFET region 102 to fill voids between gate structures and other existing devices within the semiconductor structure 100. The first ILD layer 1420 may be formed by, for example, chemical vapor deposition (CVD) of a dielectric material. Non-limiting examples of dielectric materials to form the first ILD layer 1420 include, for example, silicon oxide, silicon nitride, hydrogenated silicon carbon oxide, silicon based low-k dielectrics, flowable oxides, porous dielectrics, or organic dielectrics including porous organic dielectrics.

After deposition of the first ILD layer 1420, a chemical mechanical polishing (CMP) process is conducted in the PFET region 102 until a top surface of the fins 106 is exposed. It should be noted that during the CMP process, the hard mask 110 is removed from above the fins 106.

At this point of the manufacturing process, a top source/drain region 1422 can be formed off the exposed portion of the fins 106 following steps similar to the ones described above with respect to the bottom source/drain regions 502, 602. As may be known by those skilled in the art, the diamond shape observed in the top source/drain region 1422 may be a consequence of the different growth rates during the epitaxial deposition process inherent to each crystallographic orientation plane of the material forming the top source/drain region 1422. In other embodiments, the top source/drain region 1422 may have a shape other than the diamond shape depicted in FIG. 14.

Referring now to FIGS. 15A-15C, a second ILD layer 1520 is deposited on the semiconductor structure 100, according to an embodiment of the present disclosure. In this embodiment, FIG. 15A is a top view of the PFET region 102, FIG. 15B is a cross-sectional view of FIG. 15A taken along section line A-A (e.g., across fins 106) and FIG. 15C is a cross-sectional view of FIG. 15A taken along section line B-B (e.g., along fins 106).

According to an embodiment, a second CMP process may be conducted to ensure a flat top surface of the ILD layer 1520 prior to formation of contact holes 1540, 1542, and 1544.

Contact holes or trenches 1540, 1542, and 1544 may be formed by any photolithographic patterning process including, for example, an anisotropic etching process or plasma etching. As depicted in FIG. 13B and FIG. 13C, formation of the contact holes 1540, 1542, and 1544 exposes the top source/drain region 1422 (contact hole 1540) and the metal silicide layer 1010 above the bottom source/drain region 502 (contact holes 1542 and 1544). By performing this step, a top source/drain contact (not shown) can be subsequently formed in the contact hole 1540, a bottom source/drain contact (not shown) can be subsequently formed in the contact hole 1542, and a gate contact (not shown) can be subsequently formed in the contact hole 1544. Formation of top source/drain contacts, bottom source/drain contacts, and gate contacts may include conventional techniques well known to those skilled in the art.

Therefore, by forming a metal silicide layer above and in direct contact with low resistivity bottom source/drain epitaxy, the bottom source/drain contacts may be formed in close proximity to the bottom source/drain epitaxy thereby reducing on-resistance (Rory) in bottom source/drain contacts and improving overall device performance.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a fin extending upward from a substrate;
   a first portion of an epitaxially grown bottom source/drain region being parallel to and in direct contact with a portion of the substrate adjacent to the fin;
   a second portion of the epitaxially grown bottom source/drain region being perpendicular to the substrate and in direct contact with a bottom portion of the fin;
   a metal silicide layer extending horizontally above the first portion of the epitaxially grown source/drain region parallel to the substrate, the metal silicide layer being partially abutted by the second portion of the epitaxially grown bottom source/drain region, the metal silicide layer comprising a bottom surface and opposing sidewalls, the bottom surface of the metal silicide layer being above and in direct contact with the first portion of the epitaxially grown source/drain region, the opposing sidewalls of the metal silicide layer being in direct contact with the second portion of the epitaxially grown bottom source/drain region for preventing the metal silicide layer to contact the fin, a top surface of the metal silicide layer extending in a plane for an entire distance between the opposing sidewalls of the metal silicide layer and being coplanar with a top surface of the second portion of the epitaxially grown bottom source/drain region;
   a bottom spacer above and in direct contact with the coplanar top surface of the metal silicide layer and the top surface of the second portion of the epitaxially grown bottom source/drain region;
   a gate dielectric layer in direct contact with sidewalls of the fin;
   a gate metal layer in direct contact with the gate dielectric layer; and
   a top spacer above and in direct contact with the gate metal layer and the bottom spacer.

2. The semiconductor structure of claim 1, wherein the bottom spacer surrounds the fin.

3. The semiconductor structure of claim 1, further comprising:
   a first dielectric layer above the top spacer; and
   an epitaxially grown top source/drain region on a top surface of the fin.

4. The semiconductor structure of claim 3, further comprising:
   a second dielectric layer above the first dielectric layer, the second dielectric layer comprising a top source/drain contact on the top source/drain region;
   a bottom source/drain contact on the first portion of the epitaxially grown bottom source/drain region; and
   a gate contact on the gate metal layer, wherein the bottom source/drain contact is in close proximity to the second portion of the epitaxially grown bottom source/drain region to reduce an on-resistance of the semiconductor structure.

5. The semiconductor structure of claim 1, wherein the metal silicide layer comprises titanium silicide.

6. The semiconductor structure of claim 3, wherein the epitaxially grown top source/drain region comprises a diamond shape.

7. A semiconductor structure comprising:
   a fin extending upward from a substrate;
   a first portion of an epitaxially grown bottom source/drain region in direct contact with a portion of the substrate, the first portion of the epitaxially grown bottom source/drain region having a first thickness in a vertical direction;

a second portion of the epitaxially grown bottom source/drain region being in direct contact with the substrate and a bottom portion of the fin, the second portion of the epitaxially grown bottom source/drain region having a second thickness in the vertical direction greater than the first thickness;

a metal silicide layer comprising a bottom surface and opposing sidewalls, the bottom surface of the metal silicide layer being above and in direct contact with the first portion of the epitaxially grown source/drain region, the opposing sidewalls of the metal silicide layer being in direct contact with the second portion of the epitaxially grown bottom source/drain region, an entire top surface of the metal silicide layer in a horizontal direction being coplanar with a top surface of the second portion of the epitaxially grown bottom source/drain region;

a bottom spacer in direct contact with the top surface of the metal silicide layer and the top surface of the second portion of the epitaxially grown bottom source/drain region;

a gate dielectric layer in direct contact with sidewalls of the fin;

a gate metal layer in direct contact with the gate dielectric layer; and a top spacer in direct contact with the gate metal layer and the bottom spacer.

8. The semiconductor structure of claim 7, wherein the top surface of the metal silicide layer extends an entire distance between the opposing sidewalls of the metal silicide layer.

9. The semiconductor structure of claim 7, wherein the top spacer is in direct contact with the gate dielectric layer.

* * * * *